(12) United States Patent
Aspar et al.

(10) Patent No.: US 7,205,211 B2
(45) Date of Patent: Apr. 17, 2007

(54) METHOD FOR HANDLING SEMICONDUCTOR LAYERS IN SUCH A WAY AS TO THIN SAME

(75) Inventors: Bernard Aspar, Rives (FR); Marc Zussy, Grenoble (FR); Jean-Frédéric Clerc, Brie et Angonnes (FR)

(73) Assignee: Commisariat l'Energie Atomique, Paris (FR)

( * ) Notice: Subject to any disclaimer, the term of this patent is extended or adjusted under 35 U.S.C. 154(b) by 96 days.

(21) Appl. No.: 10/509,007

(22) PCT Filed: Mar. 26, 2003

(86) PCT No.: PCT/FR03/00954

§ 371 (c)(1),
(2), (4) Date: Sep. 24, 2004

(87) PCT Pub. No.: WO03/083930

PCT Pub. Date: Oct. 9, 2003

(65) Prior Publication Data

US 2005/0124138 A1 Jun. 9, 2005

(30) Foreign Application Priority Data

Mar. 28, 2002 (FR) .................................. 02 03909

(51) Int. Cl.
*H01L 21/78* (2006.01)
(52) U.S. Cl. ....................... 438/458; 438/459; 438/464; 438/456; 438/977
(58) Field of Classification Search ................ 438/406, 438/455, 458, 459, 464, 421, 25, 64, 66, 438/67, 964, 977, 456, 113, 118
See application file for complete search history.

(56) References Cited

U.S. PATENT DOCUMENTS 6,204,079 B1 3/2001 Aspar et al.

(Continued)

FOREIGN PATENT DOCUMENTS

FR 2 781 925 7/1998

(Continued)

*Primary Examiner*—M. Wilczewski
(74) *Attorney, Agent, or Firm*—Thelen Reid Brown Raysman & Steiner LLP

(57) ABSTRACT

This invention relates to a method for making a thin layer starting from a wafer comprising a front face with a given relief, and a back face, comprising steps consisting of:

a) obtaining a support handle with a face acting as a bonding face;
b) preparing the front face of the wafer, this preparation including incomplete planarisation of the front face of the wafer, to obtain a bonding energy $E_0$ between a first value corresponding to the minimum bonding energy compatible with the later thinning step, and a second value corresponding to the maximum bonding energy compatible with the subsequent desolidarisation operation, the bonding energy $E_0$ being such that $E_0=\alpha.E$, where E is the bonding energy that would be obtained if the front face of the wafer was completely planarised, $\alpha$ is the ratio between the incompletely planarised area of the front face of the wafer and the area of the front face of the wafer if it were completely planarised;
c) solidarising the front face of the wafer on the bonding face of the support handle, by direct bonding;
d) thinning the wafer starting from its back face until the thin layer is obtained;
e) transferring the thin layer onto a usage support, involving separation from the support handle.

27 Claims, 4 Drawing Sheets

U.S. PATENT DOCUMENTS

| | | | |
|---|---|---|---|
| 6,429,094 B1* | 8/2002 | Maleville et al. | 438/455 |
| 6,693,342 B2* | 2/2004 | Larson et al. | 257/522 |
| 6,809,009 B2* | 10/2004 | Aspar et al. | 438/459 |
| 6,933,210 B2* | 8/2005 | Inoue | 438/455 |
| 6,974,759 B2* | 12/2005 | Moriceau et al. | 438/459 |
| 6,989,314 B2* | 1/2006 | Rayssac et al. | 438/406 |
| 2001/0051415 A1 | 12/2001 | Larson et al. | |
| 2002/0022337 A1 | 2/2002 | Maleville et al. | |
| 2003/0077885 A1 | 4/2003 | Aspar et al. | |
| 2005/0245049 A1* | 11/2005 | Akatsu et al. | 438/458 |
| 2006/0014363 A1* | 1/2006 | Daval et al. | 438/455 |
| 2006/0035440 A1* | 2/2006 | Ghyselen et al. | 438/458 |
| 2006/0063353 A1* | 3/2006 | Akatsu | 438/455 |
| 2006/0076559 A1* | 4/2006 | Faure et al. | 257/49 |
| 2006/0079071 A1* | 4/2006 | Moriceau et al. | 438/459 |

FOREIGN PATENT DOCUMENTS

| | | |
|---|---|---|
| FR | 2 767 604 | 2/1999 |
| FR | 2 809 867 | 12/2001 |

* cited by examiner

METHOD FOR HANDLING SEMICONDUCTOR LAYERS IN SUCH A WAY AS TO THIN SAME

CROSS-REFERENCE TO RELATED APPLICATION

This application claims priority based on International Patent Application No. PCT/FR03/00954, entitled "Method for Handling Semiconductor Layers in Such a Way As to Thin Same" by Bernard Aspar, Marc Zussy and Jean-Frederic Clerc, which claims priority of French Application No. 02 03909, filed on Mar. 28, 2002, and which was not published in English.

TECHNICAL DOMAIN

Needs for electronic components that are very thin (between a few µm and a few tens of µm) are increasing. These ultra thin components have many advantages, principally their small size and considerable flexibility of use. For example, this type of electronic component can be integrated on plastic or paper supports. The first application is for smart cards and electronic labels. Ultra-thin electronic components are also increasingly in demand in domains such as encapsulation in order to make circuits in ultra-flat boxes.

These ultra-thin components are also essential for making vertically integrated circuits or 3D circuits. Transfer of one ultra-thin circuit onto another circuit provides a means of increasing the integration density in this manner. Applications of these 3D circuits apply to new integrated power, radio frequency, optoelectronic systems and also microprocessors.

It is also important to be able to obtain microsystem type components (in the broad Micro-Electro-Mechanical System (MEMS) sense or Micro-Optical-Electro-Mechanical Systems (MOEMS) sense) in very thin layers to facilitate integration of these micro-systems with electronic components and to obtain a completely integrated system.

In general, the so-called active layer of microelectronic components is only between a few µm (or less) and a few tens of µm thick. Therefore the interesting part of the component is only made on the surface of wafers made from a semiconducting material. However, the thickness of the substrate plays an essential mechanical role when manufacturing integrated circuits. The thickness of the substrate is what gives it sufficient mechanical strength, enables manipulation by standard automated equipment and enables control over its planeness to achieve the necessary compatibility with high resolution photolithography equipment processes. In other words, it is not feasible to produce integrated circuits directly on films of semiconducting material a few µm thick.

Therefore, there is a current need to reduce the thickness of the wafers on which components are made.

Furthermore, this need for thinning is increasingly important because the thickness of new generations of wafers increases in proportion to the diameter.

Therefore, a means has to be found for obtaining very thin electronic components (typically less than 100 µm thick). One of the best means is a collective means in which thinning is done on the entire wafer supporting all components, rather than on a single component.

STATE OF PRIOR ART

At the moment it is extremely difficult to reduce the thickness of wafers to very small values (less than 100 µm), causing yield problems. For such small thicknesses, the wafer becomes flexible and often breaks during the thinning operation before stresses have been relaxed.

One known means of overcoming this problem is to glue the wafer onto an intermediate support called the support handle, so that the thinned wafer can be held in place and manipulated without breaking. This support handle enables the wafer containing the component to be made very thin. After thinning, the thin layer obtained that is fixed to the support handle can be manipulated and transferred to another support that may be the final support.

Some methods that have been described include the techniques published in the article "Novel LSI/SOI Wafer Fabrication Using Device Layer Transfer Technique" by T. HAMAGUCHI et al., published in Proc. IEDM, 1985, pages 688 to 691. This article mentions the use of a bond layer to solidarise the substrate or the wafer to be thinned and the handle composed of an epoxy resin.

Other techniques based on the same principle were then developed using different means of bonding the substrate to be thinned onto the handle, for example such as resins or other glues. One example is the transfer of treated layers onto a glass support by thermo setting UV glues. Further information about this subject is given in the article "An Ultra Low-Power RF Bipolar Technology on Glass" by E. DEKKER et al., published in IEDM 1997, pages 921 to 923.

All presented techniques used a glue, in other words added material, to solidarise the substrate to be thinned onto a support that may be the handle or the final support. Although this additional layer produces very strong bonding forces compatible with thinning, it modifies the thickness of the structure. It is also very difficult to control the glue thickness present and its homogeneity on the wafer. These characteristics cause a problem if uniform and precise thinning within a few micrometers is necessary. Moreover, the use of glue introduces another problem if it is required to transfer the thin layer onto a final support after thinning, and eliminate the intermediate support that acts as a handle. The bonding effect needs to be destroyed, for example using a solvent. Two problems then arise. The first is that the solvent is not always compatible with the final support, for example if the final support is a plastic smart card. The second problem is that glue residues can remain that are sometimes difficult to remove.

There are other bonding methods that can be used to solidarise wafers to each other. One method that is very advantageous is the direct wafer bonding method. This technique is used in many domains to obtain some substrates, for example SOI substrates. For example, there is the well-known example of the Smartcut® method described in the article by M. BRUEL published in Electron. Letters, 31 (1995), page 1201.

The principle of direct wafer bonding can be used to solidarise two wafers without adding any material, which is very useful for the application aimed at by the invention. To achieve this bond between two wafers, they must have good surface roughness properties, surface chemistry properties (hydrophilic wafers for a hydrophilic glue or hydrophobic wafers for a hydrophobic glue), and planeness and cleanliness properties (no dust on the surface). For example, refer to the document Semiconductor Wafer-Bonding: Science and Technology by I. GOESELE and Q. Y. TONG, in Electrochemical Society, published by John Wiley and Sons, 1999.

However, the wafers on which electronic components are installed have a relief that makes it impossible to achieve the conditions required for direct wafer bonding. To obtain the required roughness and relief criteria, it is often necessary to prepare the surfaces to be brought into contact, for example using a planarisation step by mechanical-chemical polishing. For example, these preparation techniques are particularly suitable for bringing silicon oxide, silicon nitride or polysilicon surfaces into contact (see C. GUI et al., J. Electrochem. Soc. 144, 1997, page 237). The surface relief is eliminated so as to obtain a maximum contact surface area so that bonding forces are as high as possible. The structures thus obtained are irreversibly solidarised. The documents mentioned above emphasize the need to perfectly planarise contact surfaces over the entire wafer to obtain a good bond. The wafers are said to be perfectly planarised when the roughness AFM (rms) is less than or is of the order of 0.5 nm at all points. The roughness measured by AFM (Atomic Force Microscope) corresponds to the roughness measured by a tip in contact with the surface on a 100 $\mu m^2$ field.

This perfect planarisation is incompatible with wafers for which relief is necessary, particularly to maintain openings at component contact pads.

The direct wafer bonding method is also used in domains other than microelectronics, for example for manufacturing of micro-sensors or MEMS. In these other domains, some devices are made from solidarisation by direct bonding of wafers with a local recess or cavities. Information on this subject is given in T. GESSNER et al., Proc. of second Internat. Symp. on microstructures and microfabricated systems (Elec. Soc. Inc. Pennington, N.J., USA, 1995), pages 297–308 (Chicago, Ill., USA, Oct. 8–13, 1995). However, in these publications, the surfaces to be solidarised are prepared in such a way that bonding forces are very high.

The technical literature has never reported the possibility of separating structures after bonding when a planarisation preparation has been made, and when adhesion is followed by a consolidation heat treatment.

Furthermore, in their article on page 54 in their Materials Science and Engineering R report: "Wafer Direct Bonding: Tailoring Adhesion Between Brittle Materials", A. PLOSSL et al. mention that if wafers are solidarised by a hydrophilic gluing, subsequent annealing (for example at 100° C.) makes their separation difficult.

Other work has considered the possibility of controlling bonding forces obtained by direct bonding of whole wafers with no relief. This control over bonding forces provides a means of obtaining reversible bonding by controlling the roughness of the entire surface of the wafer. This is described in document FR-A-2 796 491. If a wafer has any relief, then the entire surface of the wafer has to be made plane. This is done by eliminating the relief and attempting to obtain an rms value of the surface roughness less than or of the order of 0.5 nm. The surface roughness is then modified homogeneously over the entire surface of the wafer.

Document FR-A-2 725 074 corresponding to American U.S. Pat. No. 5,683,830 divulges the possibility of transferring thin layers from a first substrate to a second substrate by controlling bonding forces.

In summary, prior art provides information about how to thin a wafer and glue it onto a support handle using different means. However, prior art does not describe any method that can be used to reversibly glue a wafer including components and with a relief that has to be partly maintained, onto an intermediate part used as a handle, this bonding being such that the wafer can be thinned and that the thinned wafer can be manipulated on its handle.

PRESENTATION OF THE INVENTION

The invention overcomes the problem described above.

Its purpose is a method for making a thin layer starting from a wafer comprising a front face divided into surface elements and with a given relief, and a back face, comprising steps consisting of:

a) obtaining a support handle with a face acting as a bonding face;

b) preparing the front face of the wafer, this preparation including incomplete planarisation of the front face of the wafer, to obtain a bonding energy $E_0$ between the bonding face of the support handle, between a first value corresponding to the minimum bonding energy compatible with the later thinning step, and a second value corresponding to the maximum bonding energy compatible with the subsequent desolidarisation operation, the bonding energy $E_0$ being such that $E_0 = \alpha . E$, where E is the bonding energy that would be obtained if the front face of the wafer was completely planarised, $\alpha$ is the ratio between the incompletely planarised surface of the front face of the wafer and the surface of the front face of the wafer if it were completely planarised;

c) solidarising the front face of the wafer on the bonding face of the support handle, by direct bonding;

d) thinning the wafer starting from its back face until the thin layer is obtained;

e) transferring the surface elements from the thin layer onto a usage support, involving separation from the support handle.

$\alpha$ is advantageously between 0.4 and 0.8.

According to a first application of the method, all surface elements are transferred onto the usage support in step e).

According to a second application of the method, surface elements are transferred individually in step e), step b) is carried out so as to obtain a bonding energy $E_0$ for each surface element, step e) being preceded by a step in which the thin layer is cut into surface elements.

According to a third application of the method, the surface elements are transferred by groups of surface elements in step e), step b) is carried out so as to obtain a bonding energy $E_0$ for each group of surface elements, step e) being preceded by a step in which the thin layer is cut into groups of surface elements.

The support handle may be cut at the same time as the thin layer is cut.

The cutting step may be made by combining a deep etching step of the thin layer and a sawing step.

In particular, the part of the wafer from which the thin layer will be obtained may include semiconducting material. The surface elements may be composed of complete or incomplete electronic components.

In step b), the incomplete planarisation may be done by a mechanical-chemical polishing method.

In step d), the wafer may be thinned by a mechanical, chemical or mechanical-chemical thinning method.

In step e), separation from the support handle may be achieved particularly by mechanical and/or pneumatic means.

In step e), the transfer takes place before separation from the support handle.

BRIEF DESCRIPTION OF THE DRAWINGS

The invention will be better understood and other advantages and specific features will become clear after reading the following description, given as a non-limitative example, accompanied by the appended drawings, wherein.

DETAILED DESCRIPTION OF EMBODIMENTS OF THE INVENTION

Figure 1:
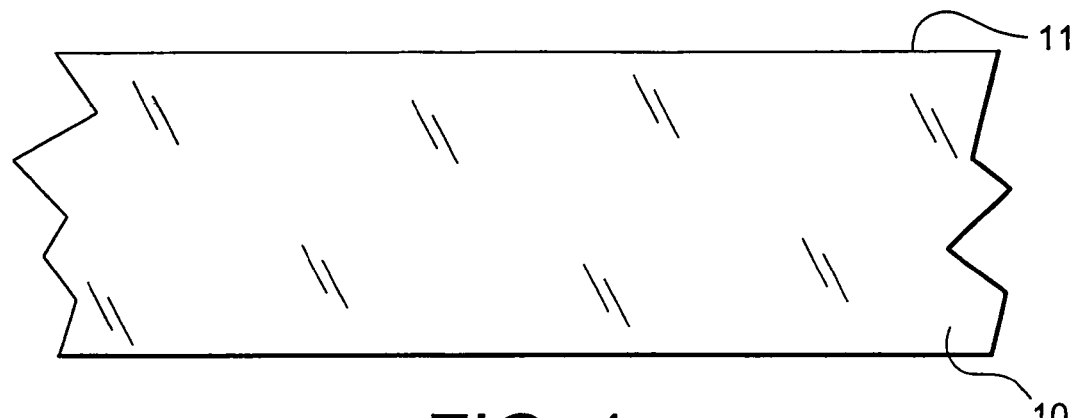
FIG. 1 is a cross-sectional view of a support handle for using the method according to the invention.

FIG. 1 is a cross-sectional view of a support handle 10, for example composed of a silicon or glass wafer. Glass has the advantage of being transparent, so that objects deposited on the back face can be inspected visually. The support handle 10 has a face 11 prepared to act as a bonding face.

Figure 2:
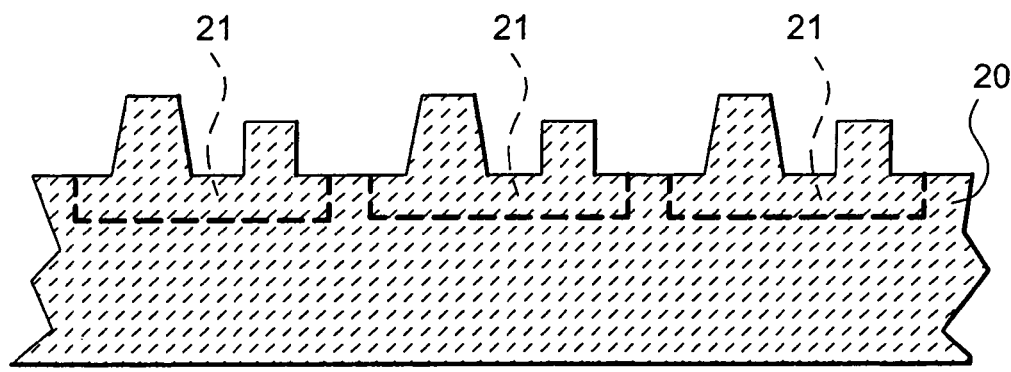
FIG. 2 is a cross-sectional view of a wafer that will be used to produce a thin layer according to the method according to the invention.

FIG. 2 is a cross-sectional view of a wafer 20 made of a semiconducting material, for example silicon. One of its main faces has been treated to make electronic components. FIG. 2 is a partial view showing three complete or incomplete components 21. Due to the presence of these components, the treated plane face has a large relief with several areas of different heights and different roughnesses. When the wafer comprises complete components, part of this relief corresponds to the presence of openings used to connect to electrical contacts.

In general, the chemical nature of the wafers to be bonded by molecular bonding, chemical cleaning before bonding and the bonding consolidation heat treatment are fixed such that a bonding energy E is obtained if the wafer on which the components are installed is fully planarised. A surface is fully planarised if its roughness is less than about 0.5 nm in every 100 µm² element on this surface (AFM measurement).

In the method according to the invention, the wafer comprising the components is prepared and then bonded onto the support handle so as to obtain molecular bonding with a controlled bonding energy $E_0$ such that $E_0 = \alpha \cdot E$ where $E_0 > E_1$ and $E_0 < E_2$. $E_1$ is the minimum bonding energy compatible with thinning. $E_2$ is the maximum bonding energy below which separation of the bonded parts is reversible. The coefficient $\alpha$ is advantageously between 0.4 and 0.8. This coefficient is the ratio between the planarised area and the total area of the wafer. In practice, the planarised area is equal to the sum of the elements of the planarised area. A planarised surface element refers to any contiguous part of the surface for which the roughness measured by AFM is less than about 0.5 nm on any 100 µm² element.

Solidarisation (or bonding) is done by direct wafer bonding, consequently there is no added material at the interface of the two solidarised parts. The total thickness of the bonded parts is not changed and thinning can be done very precisely. This precision then depends on the equipment used. If mechanical thinning is done, a precision of plus or minus µm can be obtained.

FIGS. 3A to 3D illustrate different steps in the method according to the invention.

Figure 3A:
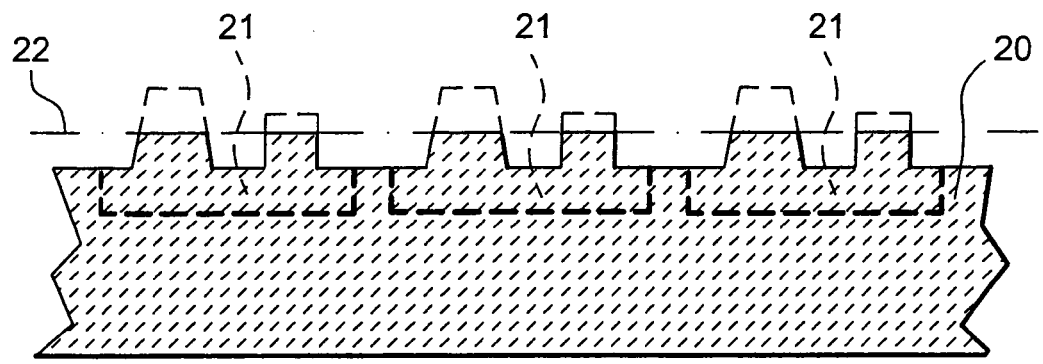
FIGS. 3A to 3F illustrate different steps in the method according to this invention.

FIG. 3A shows the wafer 20 after the planarisation operation done until level 22 is reached. Planarisation is preferably done by mechanical chemical polishing (CMP) so as to clip relief vertices sufficiently to obtain molecular bonding but without completely planarising the wafer, unlike normal practice. There is still some relief on the wafer on several levels. Only two levels are shown in FIG. 3A, but there may be more than two levels.

The bonding energy $E_1$ corresponds to the minimum bonding energy that enables thinning. Obviously, this minimum energy depends on the thinning method that may be mechanical, chemical, mechanical-chemical or other. For example, $E_1$ is equal to 500 mJ/m² for thinning by grinding and mechanical-chemical polishing.

Figure 3B:
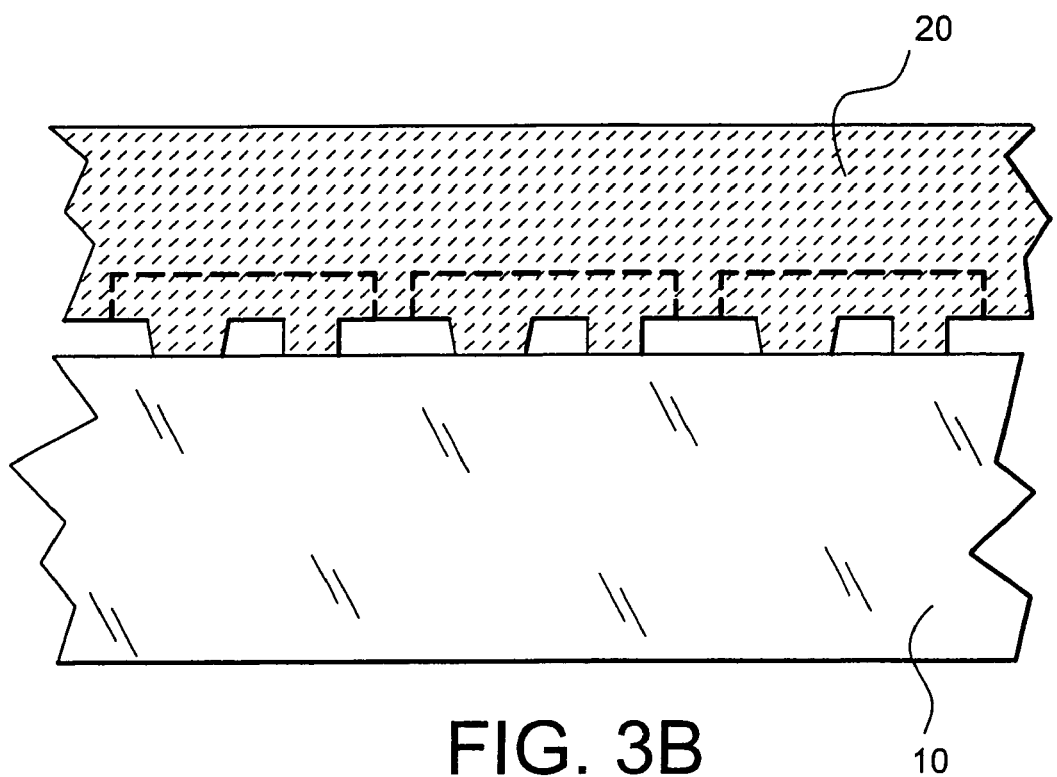

FIG. 3B shows the structure obtained when the wafer 20 is solidarised by molecular bonding on the components side with the support handle 10. The bonding energy E depends on the temperature at which the structure was annealed (if annealing is done), the nature of the materials that are put into contact ($Si_3N_4$, $SiO_2$, Si, etc.) and chemical cleaning treatments that are done before bringing into contact. Therefore, heat and chemical treatments are always chosen so as to not degrade the structure and particularly the components present. For example, for a hydrophilic bonding of two totally planarised $SiO_2$—$SiO_2$ surfaces, an energy of 1 J/m² is obtained after annealing at 300° C. for two hours. The bonding energy $E_2$ is the maximum bonding energy below which solidarisation is reversible. Obviously, it depends on the method used to separate the two wafers at the bonding interface after thinning. For example, if a blade is used to separate the two parts of the structure, $E_2$ is equal to about 800 mJ/m² (bonding energies are measured using the blade method).

Figure 3C:
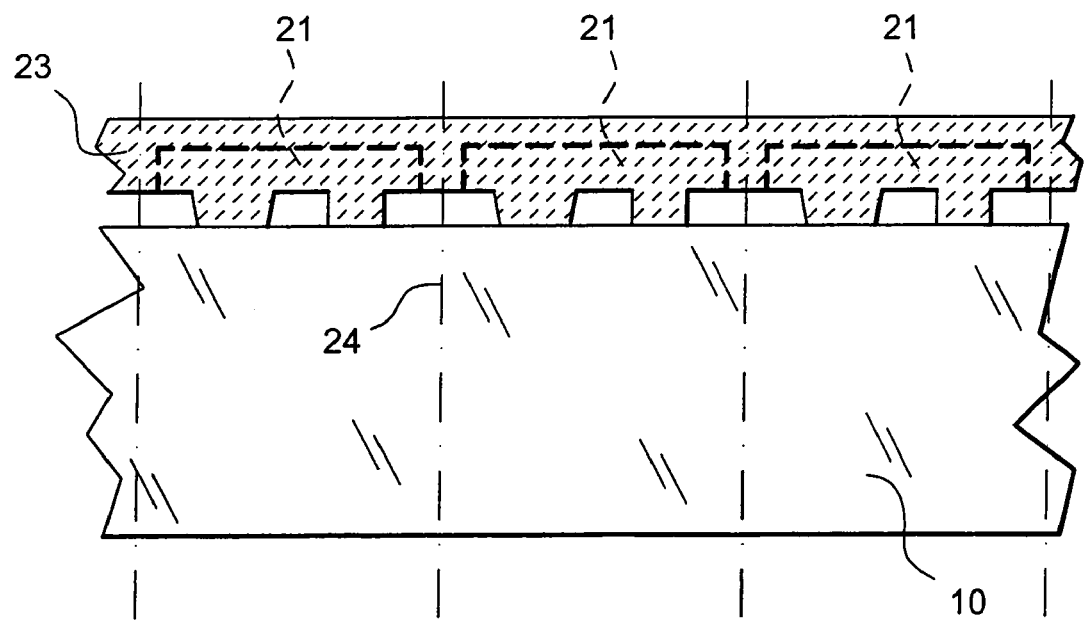

The wafer 20 bonded onto the support handle 10 is thinned through its back face to give a thin layer 23. This is shown in FIG. 3C. This thinning may be done mechanically (polishing or grinding). It may be chemical by etching using a solution that attacks the material to be thinned. It may also be mechanical-chemical; by chemical-mechanical polishing. A stop layer may also be present in the initial substrate (for example a buried oxide layer in the case of an SOI substrate). In this case, thinning is done as far as this stop layer.

After thinning, the thin layer solidarised with the support handle can be manipulated. The components of the thin layer may then be transferred collectively onto another support with the same diameter. They may also be transferred individually. If an individual transfer is requested, the components are cut on their support handle. FIG. 3C shows the cut axes 24 of the components 21.

Figure 3D:
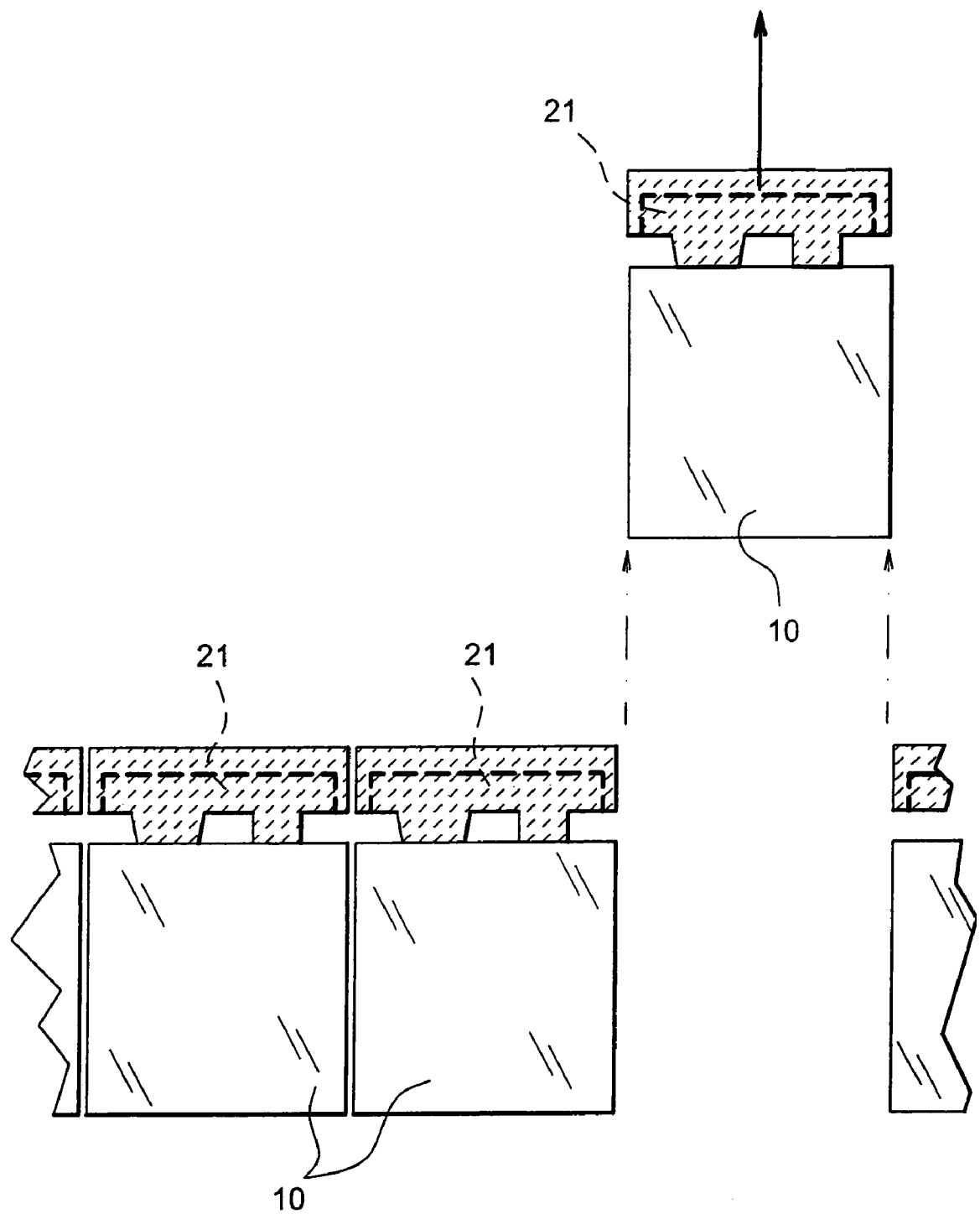

FIG. 3D shows the components and their cut supports. These cut components can be handled with conventional tools since the thinned components are on their handling support. FIG. 3D shows a component 21 and the part of the support handle 10 corresponding to it, during handling.

Figure 3E:
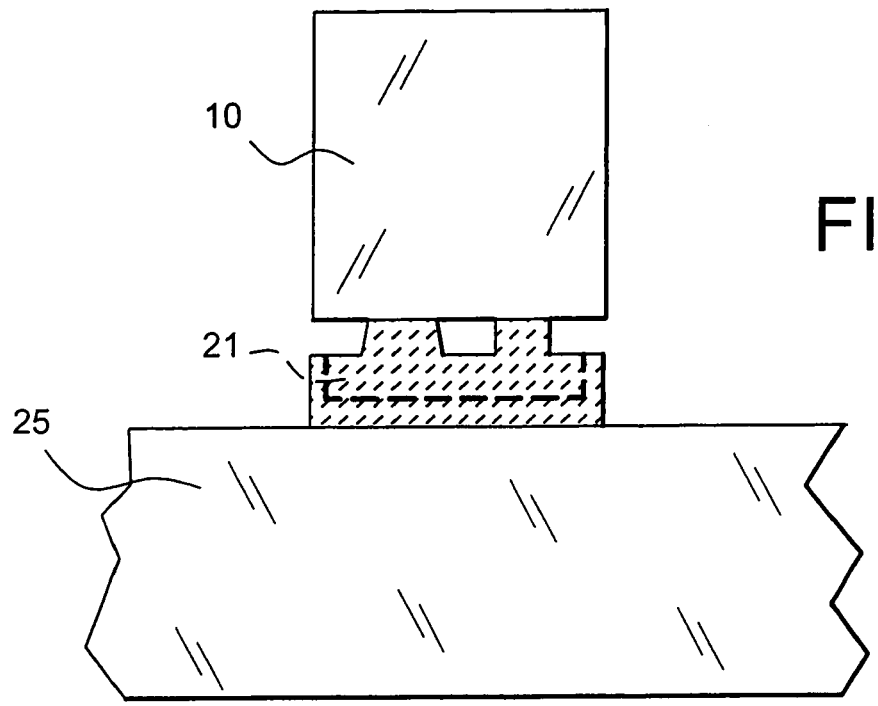
Figure 3F:
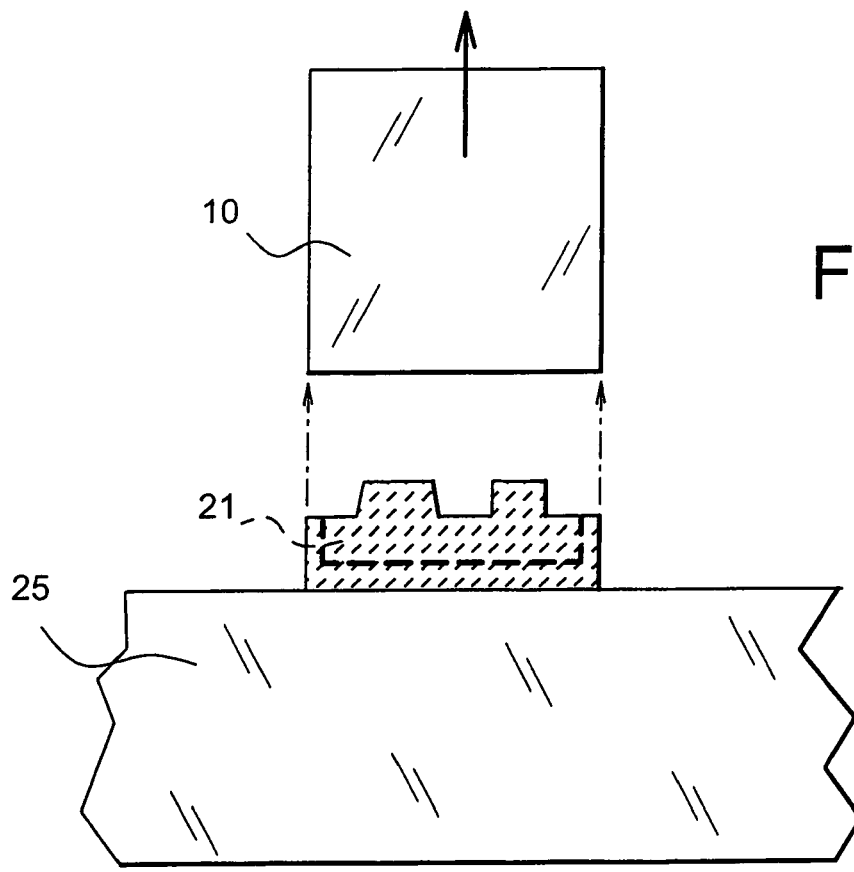

Once the component(s) is (are) transferred onto its (their) final support or onto another intermediate support, it must be possible to separate the component(s) from its (their) part of the support handle. FIG. 3E shows a component 21 transferred onto its final support 25, the component 21 still fixed to its part of the support handle 10. FIG. 3F shows the component 21 fixed on its final support 25 and separated from its part of the support handle 10. Separation may be done by any mechanical or pneumatic means used by itself or in combination. For example there is separation by insertion of a tool (Teflon® blade, metallic), by injection of a gas flow, applying a tension and/or shear force.

One variant of this method consists of only cutting the thin layer containing the elements to be transferred, or only this layer and part of the handle. The element to be transferred is then picked up at the same time as the separation between the element and the support handle. A manipulator (for example a vacuum micro-pipette) is used to transfer the element.

In another variant, the component may be separated from the support handle during the transfer. This is the case when a punch is used through a hole in a support handle.

The invention is applicable to thinning of any type of semiconductor, for example silicon, germanium, III-V semiconductors (AsGa, InP, GaN, etc.) It is also applicable to the case in which the wafer is made from an arbitrary material but which can be thinned.

We will now describe the case of a wafer comprising integrated circuits on the surface in which the contact pins are open and for which the electrical characteristics have been tested using a standard tester. This wafer has strong relief on the surface. If thinning has to be well controlled, the wafer is measured precisely before thinning to determine the thicknesses at all points of this wafer (for example by ADE).

The wafer is incompletely planarised so as to clip the peaks of the relief and to obtain plateaux with a surface area of about 2 mm² and with a roughness of less than 0.5 nm. For example, this surface may be silicon oxide or a silicon nitride. The planarised surface occupies 60% of the total area. Planarisation is done by CMP and after chemical cleaning, the wafer is brought into contact with its support handle that may be a silicon wafer oxidised on the surface or a glass wafer possibly with a deposition of silicon oxide on the surface. This wafer is then annealed at 250° C. for two hours to obtain a bonding energy of the order of 600 mJ/m². It is also possible to heat to a lower temperature and for a longer period, or vice versa to obtain a bonding energy of the same order of magnitude.

The back face of the wafer containing the integrated circuits is thinned to a thickness of 10 μm, for example by grinding followed by mechanical-chemical polishing. The circuits are then cut out with their support handle using a standard saw. One variant consists of deep etching the thin layer carrying components according to a pattern that facilitates sawing, for example etching over the entire length of the thin layer over a length longer than the saw line. The assembly is manipulated with standard "pick and place" type tools. For example, a circuit may then be transferred onto a smart card by gluing the back face of the circuit onto the final support with glue. Tension is then applied so as to separate the front face of the circuit from the support handle.

According to another variant embodiment, the back face of the circuit is bonded by direct wafer bonding onto a wafer containing other circuits in order to produce 3D circuits. The back face of the circuit may be solidarised, for example with a bonding energy equal to 1.5 J/m². This energy can be obtained using plasma cleaning. The intermediate support may be eliminated by inserting a blade at the bonding interface. A small recess may be provided at the interface to make it easier to insert the blade.

The invention claimed is:

1. Method for making a thin layer starting from a wafer comprising a front face divided into surface elements and with a given relief, and a back face, comprising steps consisting of:
   a) obtaining a support handle with a face acting as a bonding face;
   b) preparing the front face of the wafer, this preparation including incomplete planarisation of the front face of the wafer, to obtain a bonding energy $E_0$ with the bonding face of the support handle, between a first value corresponding to the minimum bonding energy compatible with the later thinning step, and a second value corresponding to the maximum bonding energy compatible with the subsequent desolidarisation operation, the bonding energy $E_0$ being such that $E_0=\alpha.E$, where E is the bonding energy that would be obtained if the front face of the wafer was completely planarised, $\alpha$ is the ratio between the incompletely planarised surface of the front face of the wafer and the surface of the front face of the wafer if it were completely planarised;
   c) solidarising the front face of the wafer on the bonding face of the support handle, by direct bonding;
   d) thinning the wafer starting from its back face until the thin layer is obtained;
   e) transferring the surface elements from the thin layer onto a usage support, involving separation from the support handle.

2. Method according to claim 1, wherein $\alpha$ is between 0.4 and 0.8.

3. Method according to claim 1, wherein all surface elements are transferred onto the usage support in step e).

4. Method according to claim 1, wherein surface elements are transferred individually in step e), step b) is carried out so as to obtain a bonding energy $E_0$ for each surface element, step e) being preceded by a step in which the thin layer is cut into surface elements.

5. Method according to claim 1, wherein surface elements are transferred by groups of surface elements in step e), step b) is carried out so as to obtain a bonding energy $E_0$ for each group of surface elements, step e) being preceded by a step in which the thin layer is cut into groups of surface elements.

6. Method according to claim 4, wherein the support handle is cut at the same time as the thin layer is cut.

7. Method according to claim 4, wherein the cutting step is made by combining a deep etching step of the thin layer and a sawing step.

8. Method according to claim 1, wherein the part of the wafer from which the thin layer will be obtained includes semiconducting material.

9. Method according to claim 8, wherein the surface elements are composed of complete or incomplete electronic components.

10. Method according to claim 1, wherein in step b), the incomplete planarisation is done by a mechanical-chemical polishing method.

11. Method according to claim 1, wherein in step d), the wafer is thinned by a mechanical, chemical or mechanical-chemical thinning method.

12. Method according to claim 1, wherein in step e), separation from the support handle is achieved particularly by mechanical and/or pneumatic means.

13. Method according to claim 1, wherein in step e), the transfer takes place before separation from the support handle.

14. Method according to claim 5, wherein the cutting step is made by combining a deep etching step of the thin layer and a sawing step.

15. Method for making a thin layer starting from a wafer comprising a front face divided into surface elements and with a given relief, and a back face, comprising steps consisting of:
   a) obtaining a support handle with a face acting as a bonding face;
   b) preparing the front face of the wafer, this preparation including incomplete planarisation of the front face of the wafer, to obtain a bonding energy E0 with the bonding face of the support handle, between a first value corresponding to the minimum bonding energy compatible with the later thinning step, and a second value corresponding to the maximum bonding energy compatible with the subsequent desolidarisation operation, the bonding energy $E_0$ being such that $E_0=\alpha.E$, where E is the bonding energy that would be obtained if the front face of the wafer was completely planarised, $\alpha$ is the ratio between the incompletely planarised surface of the front face of the wafer and the surface of the front face of the wafer if it were completely planarised, wherein $\alpha$ is between 0.4 and 0.8;

c) solidarising the front face of the wafer on the bonding face of the support handle, by direct bonding;

d) thinning the wafer starting from its back face until the thin layer is obtained;

e) transferring the surface elements from the thin layer onto a usage support, involving separation from the support handle.

16. Method according to claim 15, wherein all surface elements are transferred onto the usage support in step e).

17. Method according to claim 15, wherein surface elements are transferred individually in step e), step b) is carried out so as to obtain a bonding energy $E_0$ for each surface element, step e) being preceded by a step in which the thin layer is cut into surface elements.

18. Method according to claim 15, wherein surface elements are transferred by groups of surface elements in step e), step b) is carried out so as to obtain a bonding energy $E_0$ for each group of surface elements, step e) being preceded by a step in which the thin layer is cut into groups of surface elements.

19. Method according to claim 18, wherein the support handle is cut at the same time as the thin layer is cut.

20. Method according claim 18, wherein the cutting step is made by combining a deep etching step of the thin layer and a sawing step.

21. Method according to claim 15, wherein the part of the wafer from which the thin layer will be obtained includes semiconducting material.

22. Method according to claim 21, wherein the surface elements are composed of complete or incomplete electronic components.

23. Method according to claim 15, wherein in step b), the incomplete planarisation is done by a mechanical-chemical polishing method.

24. Method according to claim 15, wherein in step d), the wafer is thinned by a mechanical, chemical or mechanical-chemical thinning method.

25. Method according to claim 15, wherein in step e), separation from the support handle is achieved particularly by mechanical and/or pneumatic means.

26. Method according to claim 15, wherein in step e), the transfer takes place before separation from the support handle.

27. Method according to claim 19, wherein the cutting step is made by combining a deep etching step of the thin layer and a sawing step.

* * * * *